(12) United States Patent
Yoshida et al.

(10) Patent No.: US 8,134,840 B2
(45) Date of Patent: Mar. 13, 2012

(54) CIRCUIT BOARD AND MOBILE ELECTRONIC APPARATUS

(75) Inventors: Mamoru Yoshida, Kanagawa (JP);
Fumio Hashimoto, Kanagawa (JP);
Haruo Hayakawa, Kanagawa (JP);
Kazunori Kouno, Kanagawa (JP);
Kazuhiro Konishi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 460 days.

(21) Appl. No.: 12/373,325

(22) PCT Filed: Jul. 25, 2006

(86) PCT No.: PCT/JP2006/314662
§ 371 (c)(1),
(2), (4) Date: Jan. 12, 2009

(87) PCT Pub. No.: WO2008/012873
PCT Pub. Date: Jan. 31, 2008

(65) Prior Publication Data
US 2009/0310316 A1      Dec. 17, 2009

(51) Int. Cl.
*H05K 5/00* (2006.01)
(52) U.S. Cl. .................................................. 361/752
(58) Field of Classification Search .............. 361/760, 361/720, 736, 748, 799
See application file for complete search history.

(56) References Cited

U.S. PATENT DOCUMENTS

| | | | | |
|---|---|---|---|---|
| 6,034,874 A * | 3/2000 | Watanabe | | 361/704 |
| 6,356,768 B1 * | 3/2002 | Saito et al. | | 455/572 |
| 7,013,558 B2 * | 3/2006 | Bachman | | 29/832 |
| 7,936,565 B2 * | 5/2011 | Muro et al. | | 361/749 |
| 2002/0007964 A1 * | 1/2002 | Mori et al. | | 174/260 |
| 2002/0051343 A1 * | 5/2002 | Prasher | | 361/720 |
| 2002/0097194 A1 * | 7/2002 | Uchida et al. | | 345/3.1 |
| 2002/0131245 A1 * | 9/2002 | Clayton et al. | | 361/736 |
| 2002/0131251 A1 * | 9/2002 | Corisis et al. | | 361/760 |
| 2003/0193787 A1 * | 10/2003 | Manabe et al. | | 361/752 |
| 2006/0126310 A1 * | 6/2006 | Watanabe | | 361/720 |

(Continued)

FOREIGN PATENT DOCUMENTS

| | | |
|---|---|---|
| JP | 7-297563 A | 11/1995 |
| JP | 8-167677 A | 6/1996 |
| JP | 2000-200978 A | 7/2000 |

(Continued)

OTHER PUBLICATIONS

International Search Report for PCT/JP2006/314662.

*Primary Examiner* — Lisa Lea Edmonds
*Assistant Examiner* — Xanthia C Cunningham
(74) *Attorney, Agent, or Firm* — Seed IP Law Group PLLC

(57) ABSTRACT

A circuit board in which the attachment strength of a frame member to a substrate can be improved, and a mobile electronic apparatus are provided.

A circuit board 16 has: a substrate 28; plural electronic components 29 which are mounted on the substrate 28; and a frame member 30 which is attached to the substrate 28 so as to surround the electronic components 29. A resin portion 36 is formed by a resin which is filled into the frame member 30. The circuit board 16 has: a lower bent portion 41 (contact portion) which is disposed in a basal end portion 38B of a wall portion 38 of the frame member 30 along the substrate 28; and a raised portion 42 which is disposed in an outer end portion 41A of the lower bent portion 41.

8 Claims, 12 Drawing Sheets

U.S. PATENT DOCUMENTS

| | | | | |
|---|---|---|---|---|
| 2006/0171130 | A1* | 8/2006 | Konishi et al. | 361/760 |
| 2006/0240697 | A1* | 10/2006 | Cronch et al. | 439/260 |
| 2009/0147482 | A1* | 6/2009 | Katsuro | 361/721 |
| 2010/0309639 | A1* | 12/2010 | Nagaike | 361/760 |

FOREIGN PATENT DOCUMENTS

| | | |
|---|---|---|
| JP | 3241669 B | 10/2001 |
| JP | 2003-258446 A | 9/2003 |

\* cited by examiner

CIRCUIT BOARD AND MOBILE ELECTRONIC APPARATUS

TECHNICAL FIELD

The present invention relates to a circuit board in which plural electronic components are mounted on a substrate, and a frame member is attached to the substrate so as to surround the electronic components, and also to a mobile electronic apparatus such as a mobile telephone.

BACKGROUND ART

A circuit board which is accommodated in a mobile terminal such as a mobile telephone comprises a substrate on which a circuit pattern is formed, and plural electronic components which are mounted on the substrate by fixing terminal portions to the circuit pattern through solder.

Recently, a circuit board is proposed in which the mounting strength of an electronic component is improved by a resin portion (underfill) that covers a part of the body of the electronic component, and that is in close contact with a substrate (see Patent Reference 1).

Patent Reference 1 can be applied also to the case where the mounting strength is improved by a resin portion that collectively covers the whole of plural electronic components mounted on a substrate.

Patent Reference 1: Japanese Patent No. 3,241,669

DISCLOSURE OF THE INVENTION

Problem that the Invention is to Solve

In the case where the mobile terminal is dropped, or where an external force such as twisting or bending is applied to a case, however, there is the possibility that the frame member is separated from the substrate, or that a lid member is dropped off from the frame member.

The invention has been conducted in order to solve the above-discussed problem. It is an object of the invention to provide a circuit board in which the attachment strength of a frame member to a substrate can be improved, and a mobile electronic apparatus.

Means for Solving the Problem

The circuit board of the invention comprises: a substrate; plural electronic components which are mounted on the substrate; a frame member which is attached to the substrate so as to surround the electronic components; a contact portion which is disposed on the frame member, and which is in contact with the substrate along the substrate; and a resin portion which covers the electronic components inside the frame member.

Here, as the contact portion, for example, a plate-like portion may be exemplified.

The contact portion may be disposed in the inside or outside of the frame member, or in one or both of the inside and the outside, and is not required to be continuous along the periphery of the frame member.

Such a contact portion may be disposed integrally with a wall portion constituting the frame member by bending a lower end portion of the wall portion toward the inside or the outside, or a separate plate-like member may be connected to the lower end portion of the wall portion by adequate means such as welding.

In such a circuit board, the frame member is attached to a mounting surface of the substrate through the contact portion, and hence the contact area with respect to the substrate can be increased as compared with the prior art.

In the circuit board, therefore, the attachment strength of the frame with respect to the substrate can be improved, and also the bending strength and the twisting strength can be improved.

In the circuit board of the invention, the contact portion is disposed while being directed to an outside of the frame member, and the circuit board comprises a raised portion in which a part of the contact portion is raised in a vertical direction with respect to the substrate.

Here, as the raised portion, a structure in which a plate-like or columnar portion is erected from an arbitrary place of the contact portion in parallel to, for example, the wall portion may be exemplified. However, the raised portion is not required to be continuous along the periphery of the wall portion.

The vertical direction means a direction which is identical with the height direction of the electronic components extended from the mounting surface of the substrate, and the raised angle to the mounting surface of the substrate, the raised dimension, and the like are arbitrary.

The raised portion may be disposed integrally with the contact portion by bending an end portion of the contact portion, or a separate plate-like member may be connected to an end portion of the contact portion or an arbitrary position by adequate means such as welding.

In such a circuit board, the contact portion which is disposed while being directed toward the outside of the frame member comprises the raised portion. When a lib disposed on the rear side of a cover of a case constituting a mobile electronic apparatus is engaged with the raised portion, for example, relative positioning between the circuit board and the cover can be easily performed, and the circuit board can be integrated with the frame member through the frame member, whereby the strength of the mobile electronic apparatus can be improved.

In such a circuit board, when another electronic component such as a display device to be stacked on the circuit board is engaged with the raised portion, relative positioning between the circuit board and the other electronic component can be easily performed because of the above-mentioned reason, and the strength improvement due to the integration of the circuit board and the other electronic component is attained.

Alternatively, the circuit board of the invention comprises: a substrate; plural electronic components which are mounted on the substrate; a frame member which is attached to the substrate so as to surround the electronic components; and a resin portion which covers the electronic components inside the frame member, and a part of the frame member comprises a contact portion which is in contact with the substrate along the substrate.

In the circuit board of the invention, a part of the frame member comprises a raised portion which is raised in a vertical direction with respect to the substrate.

In the circuit board of the invention, a part of the frame member has a recess which is in contact with the substrate along the substrate.

The circuit board of the invention is characterized in that an electrically conductive adhesive agent is applied to an upper face of the resin portion.

In such a circuit board, the conductive adhesive agent is applied to the upper face of the resin portion. Therefore, even in the case where a lid member is not attached to the frame member, for example, a shielding property is obtained, and, in the case where a lid member is attached to the frame member, electrically conductivity between the frame member and the lid member is obtained, and hence the shielding property can be further improved.

The mobile electronic apparatus of the invention employs the above-described circuit board, and comprises: a substrate; plural electronic components which are mounted on the substrate; a frame member which is attached to the substrate so as to surround the electronic components; a contact portion which is disposed on the frame member, and which is in contact with the substrate along the substrate; a resin portion which covers the electronic components inside the frame member; a raised portion in which a part of the contact portion is raised in a vertical direction with respect to the substrate; and a cover portion between the frame member and the raised portion.

According to the configuration, the frame member and a cover can be integrated with each other, and the dropping strength of the mobile electronic apparatus can be further improved.

Effects of the Invention

According to the circuit board and mobile electronic apparatus of the invention, the contact portion which is in surface contact with the mounting surface of the substrate is disposed in the frame member, and hence an effect that the attachment strength of the frame member to the substrate can be improved is achieved.

Figure 1:
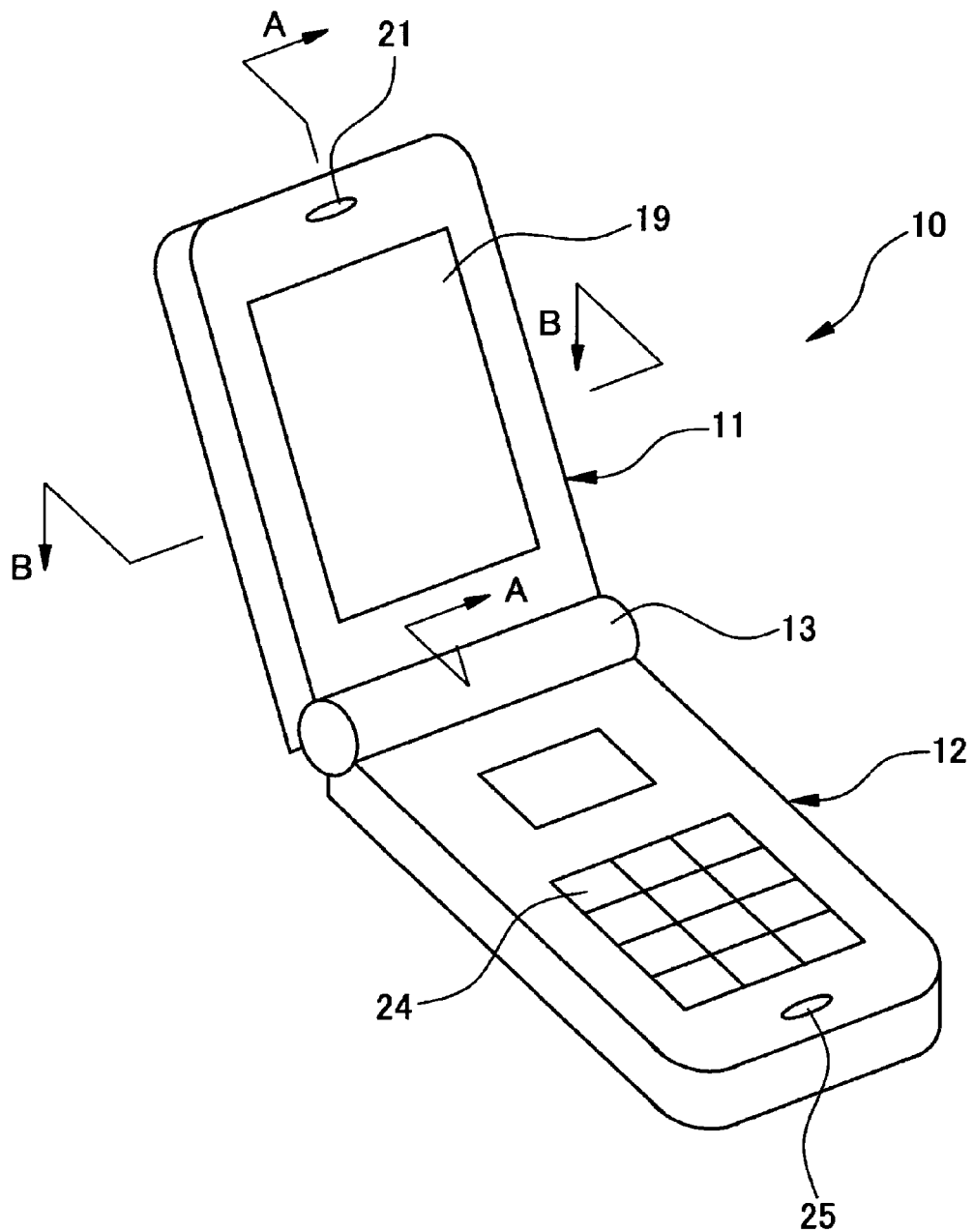
FIG. 1 is a perspective view showing a mobile electronic apparatus comprising the circuit board (first embodiment) of the invention.

DESCRIPTION OF REFERENCE NUMERALS AND SIGNS 10 mobile terminal (mobile electronic apparatus)
16, 60 circuit board
28 substrate
29 electronic component
30 frame member
31 opening of frame member
34 lid member
36 resin portion
36A upper face of resin portion
38 wall portion of frame member
38B basal end portion
41 lower bent portion (contact portion)
42 raised portion
61 electrically conductive adhesive agent

BEST MODE FOR CARRYING OUT THE INVENTION (First Embodiment)

Hereinafter, a circuit board of an embodiment of the invention will be described with reference to the drawings.

As shown in FIG. 1, a mobile terminal 10 which is a mobile electronic apparatus of a first embodiment comprises an upper case (case) 11, and a lower case 12 which is rotatably coupled to the upper case 11 through a coupling portion 13. The mobile terminal is configured so that, when the upper case 11 and the lower case 12 are relatively moved through the coupling portion 13, it is possible to select a mobile state where the upper case 11 and the lower case 12 are stacked with each other, or an extended state (the illustrated state) where the upper case 11 and the lower case 12 are separately placed.

Figure 2:
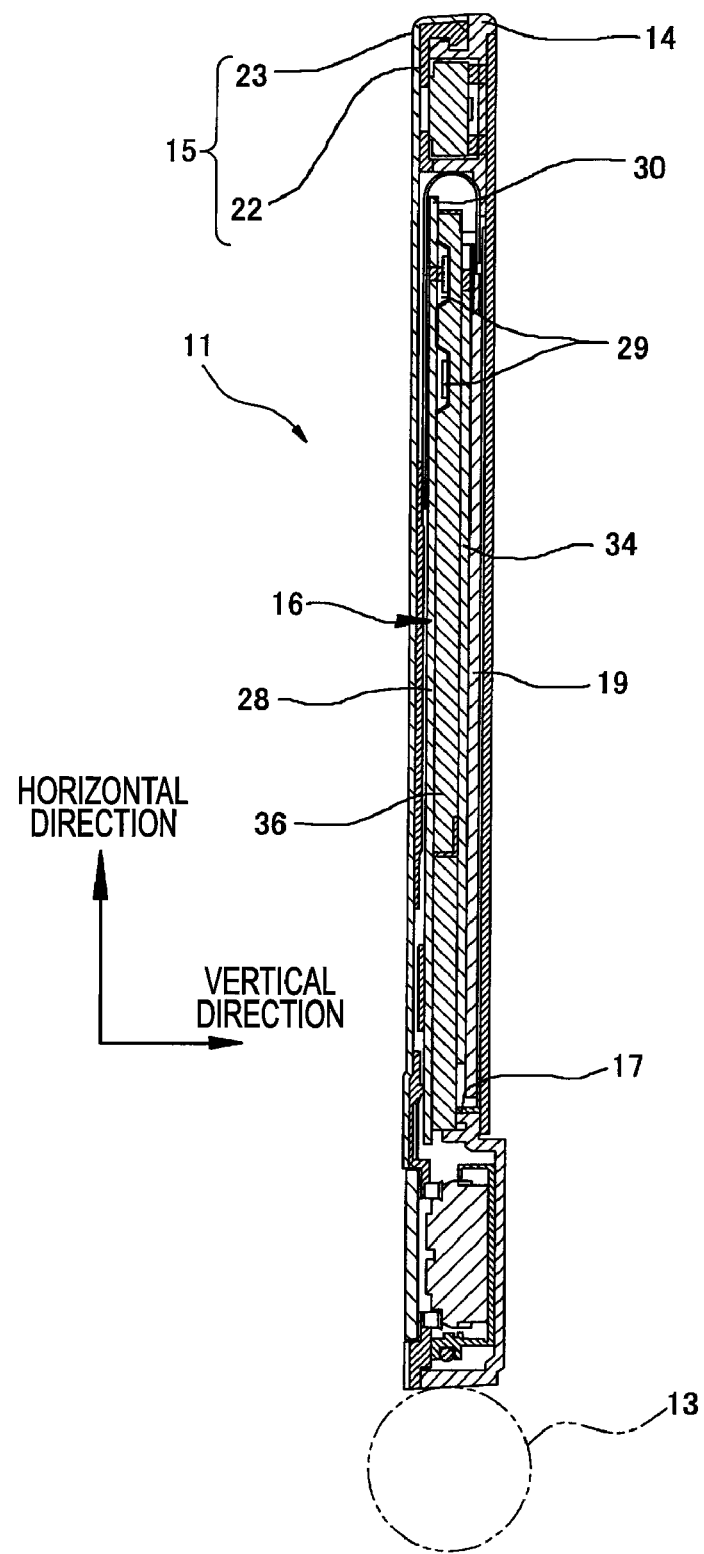
FIG. 2 is a section view taken along the line A-A in FIG. 1.
Figure 3:
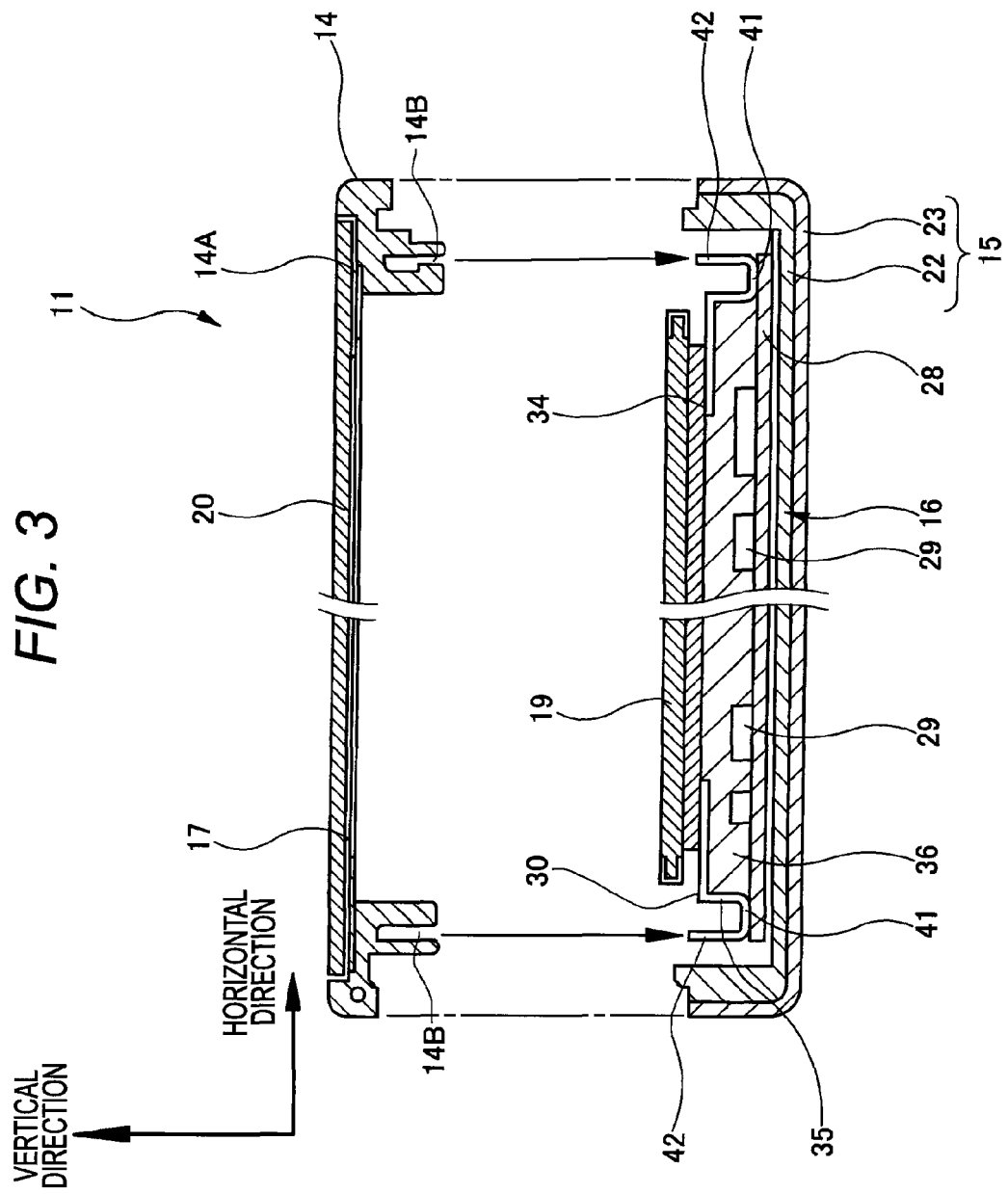
FIG. 3 is an exploded section view along the line B-B in FIG. 1.
Figure 4:
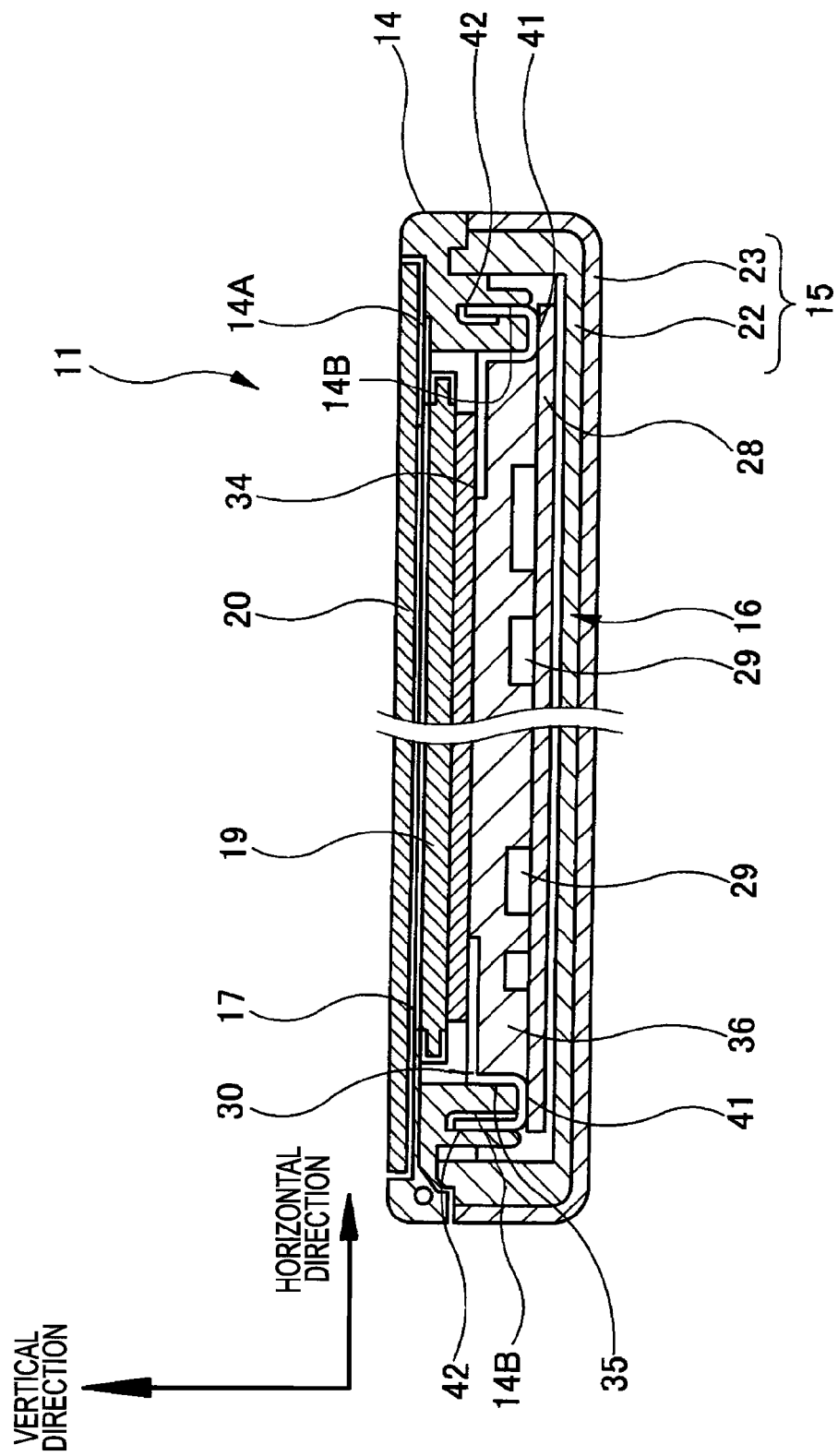
FIG. 4 is a section view taken along the line B-B in FIG. 1.

As shown in FIGS. 2 to 4, the upper case 11 is configured by a front cover 14 and a rear cover 15, and a circuit board 16 is accommodated between the front cover 14 and the rear cover 15.

An opening portion 17 is formed in the surface 14A of the front cover 14, a displaying portion 19 is placed so as to be exposed through the opening portion 17, and the surface 14A of the front cover 14 and the displaying portion 19 are covered by a panel 20 (see FIGS. 3 and 4).

The rear cover 15 is formed into a two-layer structure by a resin-made cover 22 and a metal-made cover 23.

In the upper case 11, as shown in FIG. 1, an earpiece portion 21 is disposed above the displaying portion 19. In the lower case 12, an operating portion 24 and a mouthpiece portion 25 are provided on the surface.

Hereinafter, the circuit board 16 of the invention will be described with reference to FIGS. 2 to 7.

As shown in FIGS. 2 to 4, the circuit board 16 comprises: a substrate 28; plural electronic components 29 which are mounted on a mounting surface of the substrate 28; a frame member 30 which is attached to the substrate 28 so as to surround the electronic components 29; a lid member 34 which closes an opening 31 of the frame member 30; and an electrically conductive adhesive agent 35 (see FIG. 7) which is interposed between the frame member 30 and the lid member 34. A resin portion 36 is formed by a resin which is filled into the frame member 30.

Figure 5:
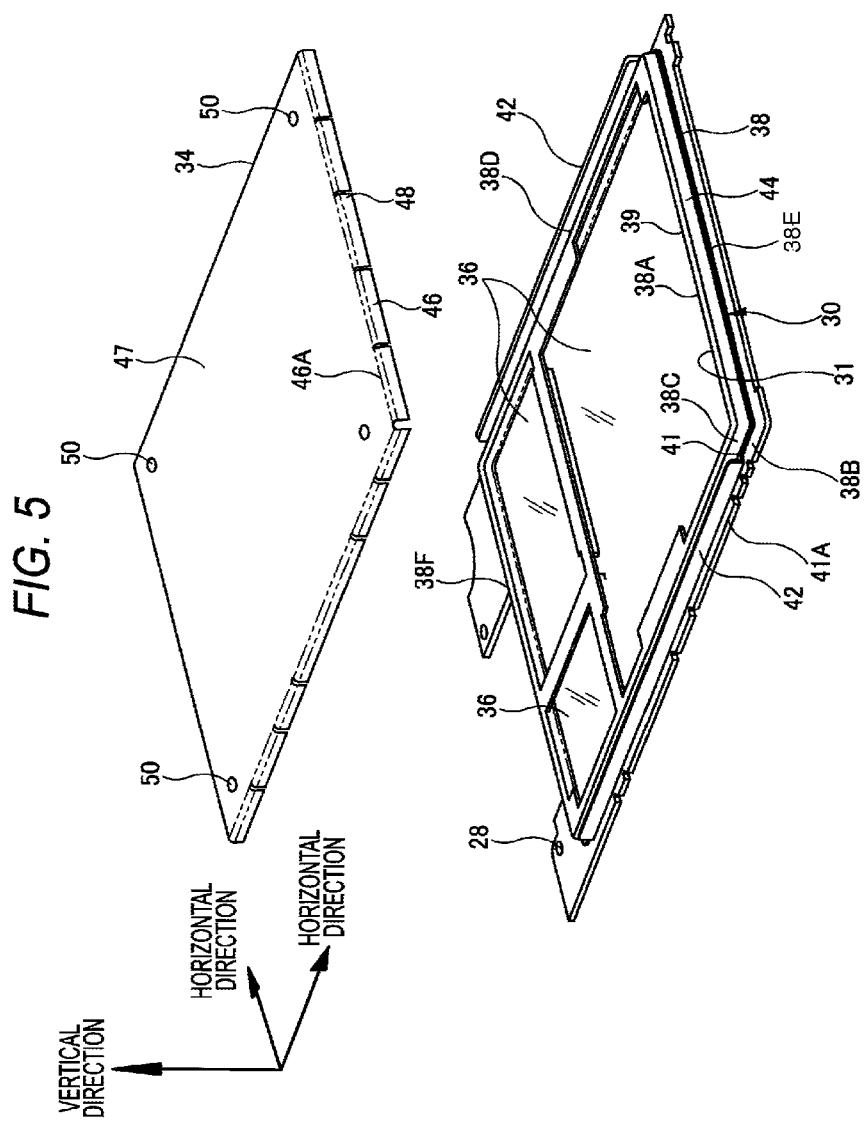
FIG. 5 is an exploded perspective view showing a frame member and lid member of the circuit board of the first embodiment.
Figure 6:
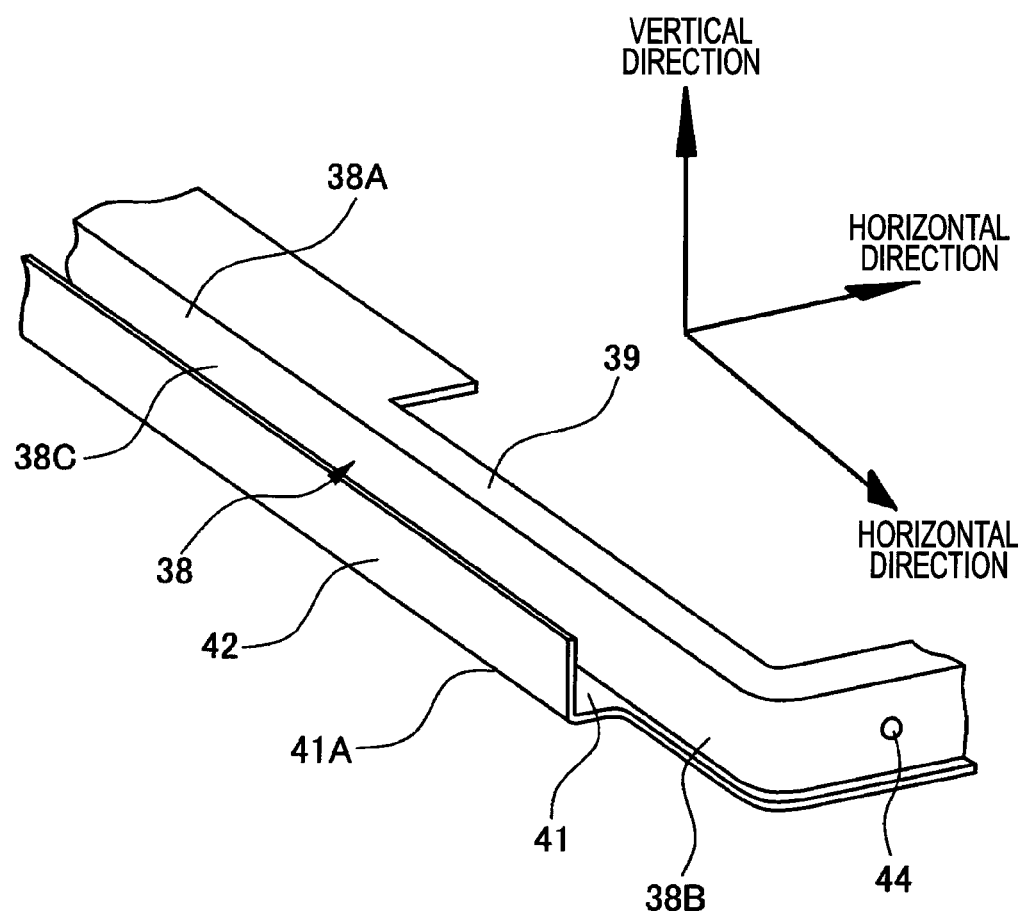
FIG. 6 is an enlarged view of a portion C in FIG. 5.

As shown in FIG. 5, the frame member 30 has: a wall portion 38 which is formed into, for example, a substantially rectangular shape; an upper bent portion 39 which is disposed in an upper end portion 38A (see also FIGS. 6 and 7) of the wall portion 38; a lower bent portion 41 (contact portion) which is disposed in a basal end portion 38B (see also FIGS. 6 and 7) of the wall portion 38; and a raised portion 42 which is disposed in an outer end portion 41A of the lower bent portion 41.

The wall portion 38 is formed into a substantially rectangular shape by: a pair of vertical side walls 38C, 38D which are opposed to each other; one lateral side wall 38E which is disposed on one-end sides of the pair of vertical side walls 38C, 38D; and another lateral side wall 38F which is disposed on other-end sides of the pair of vertical side walls 38C, 38D.

Basal end portions 38B of the pair of vertical side walls 38C, 38D, and basal end portions 38B of the pair of lateral side walls 38E, 38F butt against the substrate 28.

Namely, the basal end portions 38B of the pair of vertical side walls 38C, 38D, and the basal end portions 38B of the pair of lateral side walls 38E, 38F constitute the basal end portion 38B of the wall portion 38.

Projections 44 are disposed at regular intervals on the pair of vertical side walls 38C, 38D and the pair of lateral side walls 38E, 38F.

Figure 7:
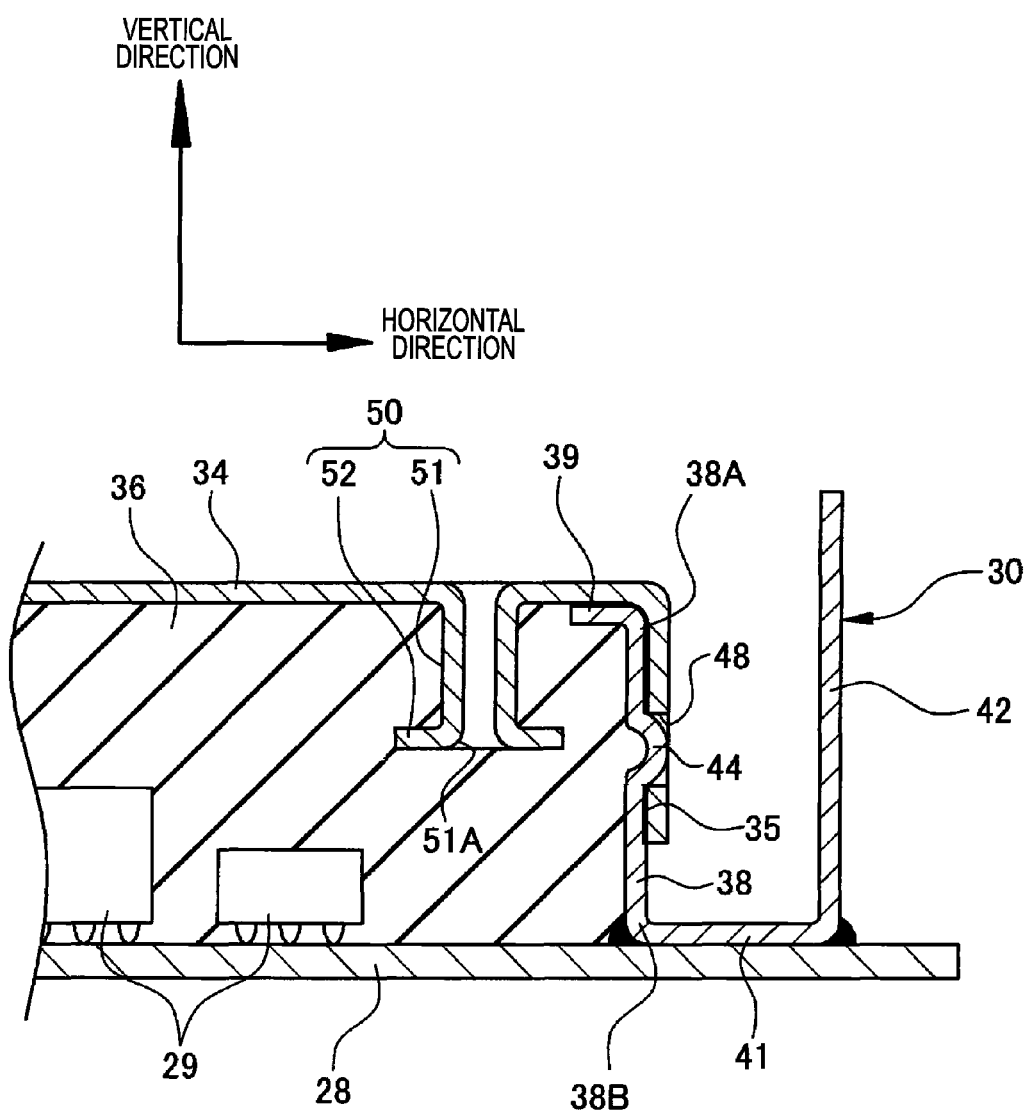
FIG. 7 is a section view showing the circuit board of the first embodiment.

As shown in FIG. 7, the projections 44 are portions which are projected toward the outside of the frame member 30.

The reason why the projections 44 are disposed on the vertical side walls 38C, 38D and the lateral side walls 38E, 38F will be described later.

The upper bent portion 39 is disposed in the whole periphery of the upper end portion 38A of the wall portion 38. As shown in FIG. 7, the upper bent portion 39 is extended in parallel with the substrate 28 from the upper end portion 38A toward the inside of the frame member 30.

The lower bent portion 41 is disposed in the basal end portions 38B of the pair of vertical side walls 38C, 38D in the wall portion 38. As shown in FIG. 7, the lower bent portion 41 is extended along the mounting surface of the substrate 28 from the basal end portion 38B toward the outside of the frame member 30.

The configuration in which the lower bent portion 41 is disposed along the mounting surface of the substrate 28 allows the lower bent portion 41 to function as a contact portion which is in surface contact with the mounting surface of the substrate 28.

Therefore, the contact area of the frame member 30 with respect to the substrate 28 can be increased, and the attachment strength of the frame 30 with respect to the substrate 38 can be improved.

Moreover, the bending strength and the twisting strength can be improved by the increase of the contact area of the frame member 30 with respect to the substrate 28.

The raised portion 42 is disposed in the whole area of the outer end portion 41A of the lower bent portion 41.

The raised portion 42 is disposed so as to be raised in a direction along which it separates from the outer end portion 41A of the lower bent portion 41 along the thickness direction of the substrate 28.

According to the configuration, when a groove portion 14B of the front cover 14 constituting the upper case 11 is engaged with the raised portion 42 as shown in FIGS. 3 and 4, the front cover 14 can be integrated with the raised portion 42, i.e., the frame member 30, and the strength can be improved.

The engagement of the groove portion 14B with the raised portion 42 may be performed by pressingly inserting the raised portion 42 into the groove portion 14B, or by loosely inserting the raised portion 42 into the groove portion 14B via an air gap.

The displaying portion 19 (see FIG. 1) which is stacked on the frame member 30 is engaged with the raised portion 42, whereby the strength can be improved.

The raised portion 42 plays also a role of a rib, so that the strength can be further improved.

In addition, when the front cover 14 is engaged with the raised portion 42, the positioning of the front cover 14 with respect to the frame member 30 can be easily performed.

In the specification, a region defined by the wall portion 38, the lower bent portion 41, and the raised portion 42 is configured as a recess.

As shown in FIG. 5, the lid member 34 is put on the frame member 30. The lid member 34 has: a side wall 46 which is formed into a rectangular shape that is slightly larger than the frame member 30; and a lid body 47 which is disposed on an upper end portion 46A of the side wall 46.

In the side wall 46, opening portions 48 are formed at the regular intervals. When the lid member 34 is put on the frame member 30, the opening portions 48 are engaged with the above-described projections 44 (see FIG. 7).

Specifically, when the lid member 34 is put on the frame member 30, the opening portions 48 are fitted on the projections 44, and the opening portions 48 are engaged with the projections 44.

The lid body 47 has plural protruding portions 50 which are protruded at arbitrary places of the lid body 47 toward the inside of the lid member 34 (i.e., the inside of the frame member).

As shown in FIG. 7, each of the protruding portions 50 has: a hanging portion 51 which is formed into a cylindrical shape; an extended portion 52 which is extended toward the outside from a lower end portion 51A of the hanging portion 51.

The hanging portions 51 are projected so as to be directed from the lid body 47 in the thickness direction of the substrate 28 toward the substrate 28.

The extended portions 52 are extended along the face direction of the substrate 28.

Namely, the hanging portions 51 and the extended portions 52 are formed so that their sections have a substantially L-like shape, and embedded into the resin portion 36. Since the section shapes of the hanging portions 51 and extended portions 52 are formed into a substantially L-like shape, the protruding portions 50 can have a shape which hardly drops off from the resin portion 36.

The protruding portions 50 having a substantially L-like shape are disposed on the lid member 34, and embedded into the resin portion 36, whereby, when the resin filled into the frame member 30 is cured, the resin is caused to contract, so that the protruding portions 50 are pulled by the resin portion 36 toward the frame member 30.

As a result, the lid member 34 is pulled toward the frame member 30, and hence the lid member 34 can be made in close contact with the frame member 30 in following to the contraction of the resin portion 36.

In this way, the close contact of the lid member 34 with the frame member 30 can improve the attachment strength of the lid member 34 with respect to the frame member 30, and further improve the shielding property.

Moreover, the interposition of the electrically conductive adhesive agent 35 between the frame member 30 and the lid member 34 can still further improve the shielding property.

As another effect, the embedding of the protruding portions into the resin portion enables the substrate, the frame member, the lid member, and the resin portion to be integrated with one another, thereby attaining a synergistic effect for rigidification of the circuit board.

(Second Embodiment)

Next, a circuit board 60 of a second embodiment will be described with reference to FIG. 8.

Figure 8:
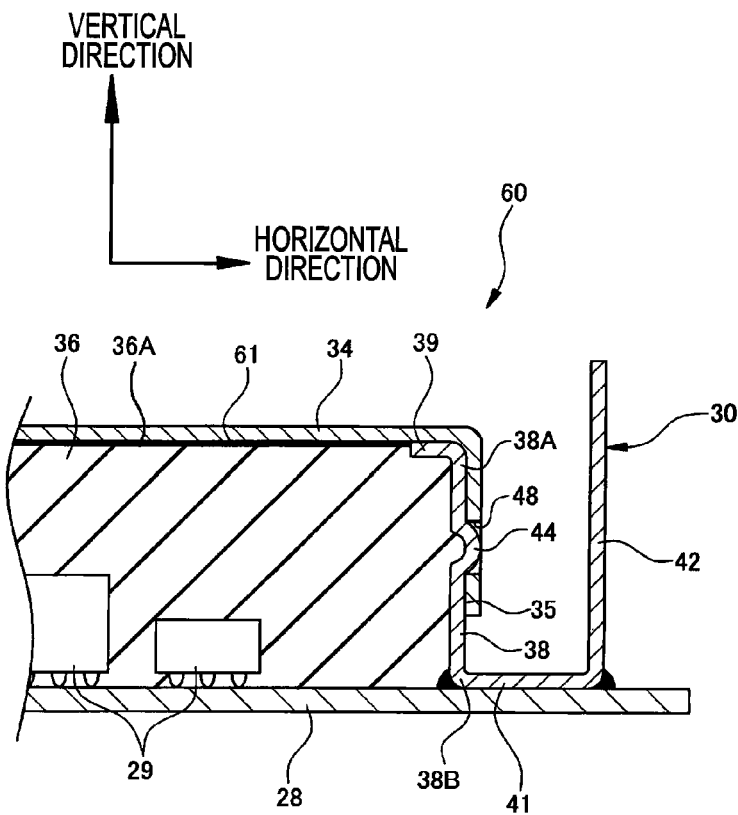
FIG. 8 is a section view showing the circuit board (second embodiment) of the invention.

In the circuit board 60 of the second embodiment shown in FIG. 8, an electrically conductive adhesive agent 61 is applied to the upper face 36A of the resin portion 36. The other configuration is identical with that of the circuit board 16 of the first embodiment.

The electrically conductive adhesive agent 61 is an adhesive agent which is identical with the electrically conductive adhesive agent 35 of the first embodiment.

In the circuit board 60, the application of the electrically conductive adhesive agent 61 to the upper face 36A of the resin portion 36 can still further improve the shielding property.

Next, Modifications 1 to 4 of the raised portion 42 and lower bent portion 41 of the first and second embodiments will be described with reference to FIGS. 9 to 12.

Figure 9:
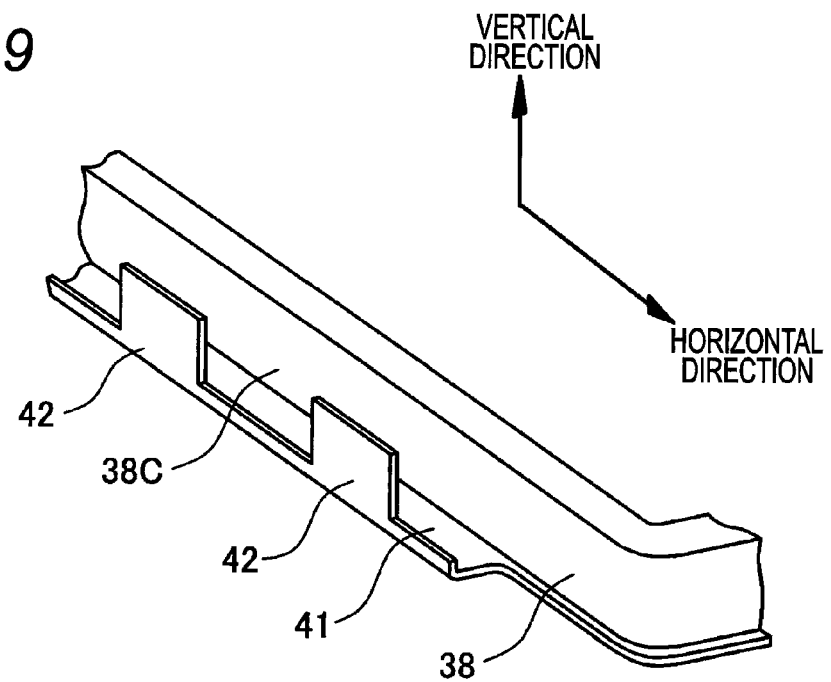
FIG. 9 is a perspective view showing Modification 1 of the circuit board of the invention.

In Modification 1 shown in FIG. 9, the raised portion 42 is not disposed in the whole area of the lower bent portion 41, but disposed in a part of the lower bent portion 41.

Figure 10:
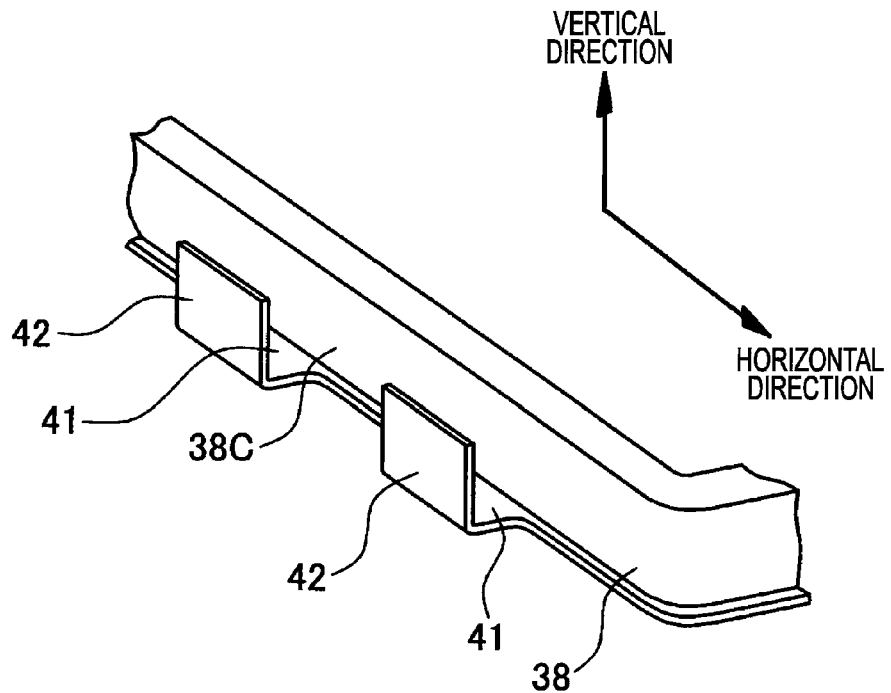
FIG. 10 is a perspective view showing Modification 2 of the circuit board of the invention.

In Modification 2 shown in FIG. 10, the raised portion 42 and the lower bent portion 41 are not disposed in the whole area of the vertical side wall 38C, but disposed in a part of the vertical side wall 38C.

Figure 11:
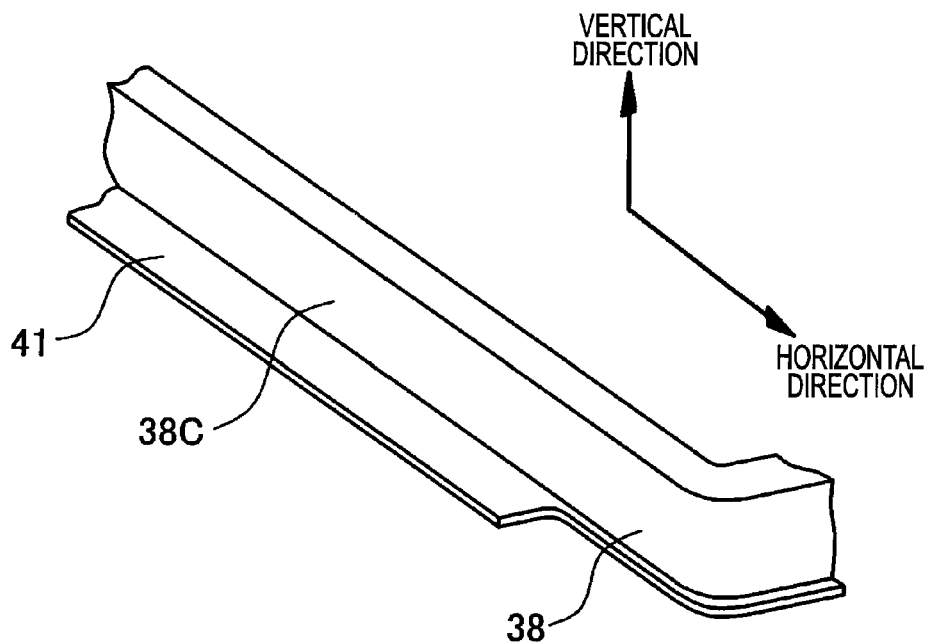
FIG. 11 is a perspective view showing Modification 3 of the circuit board of the invention.

In Modification 3 shown in FIG. 11, the raised portion 42 is not disposed, and only the lower bent portion 41 is disposed.

Figure 12:
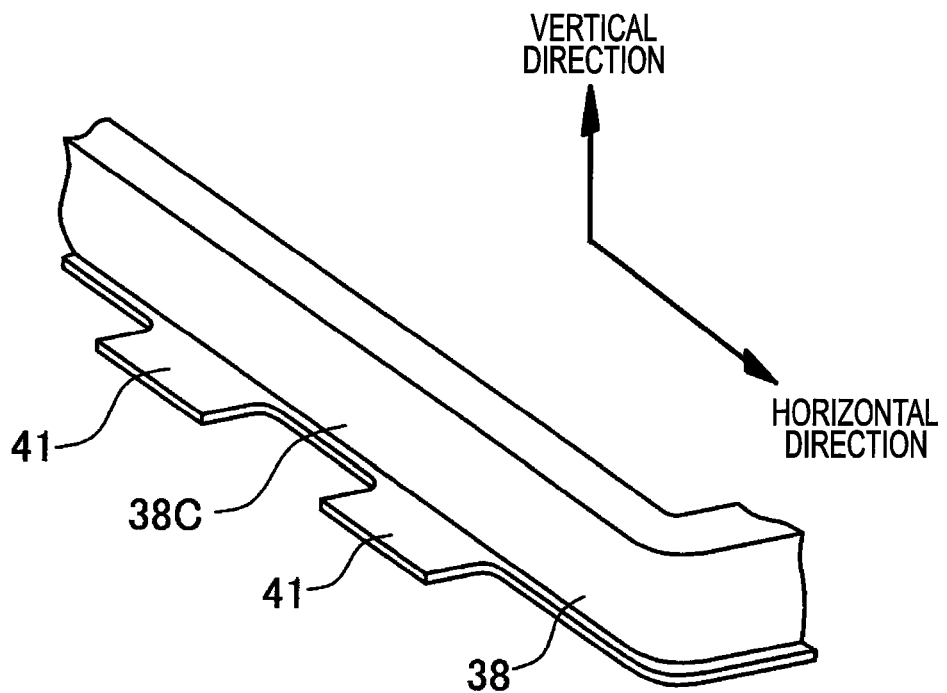
FIG. 12 is a perspective view showing Modification 4 of the circuit board of the invention.

In Modification 4 shown in FIG. 12, the raised portion 42 is not disposed, and only the lower bent portion 41 is disposed so that the lower bent portion 41 is not disposed in the whole area of the vertical side wall 38C, but disposed in a part of the vertical side wall 38C.

According to Modifications 1 to 4, it is possible to achieve the same effects as the circuit boards 16, 60 of the first and second embodiments.

Next, Modifications 5 to 8 of the protruding portions 50 of the first and second embodiments will be described with reference to FIGS. 13 to 16.

Figure 13:
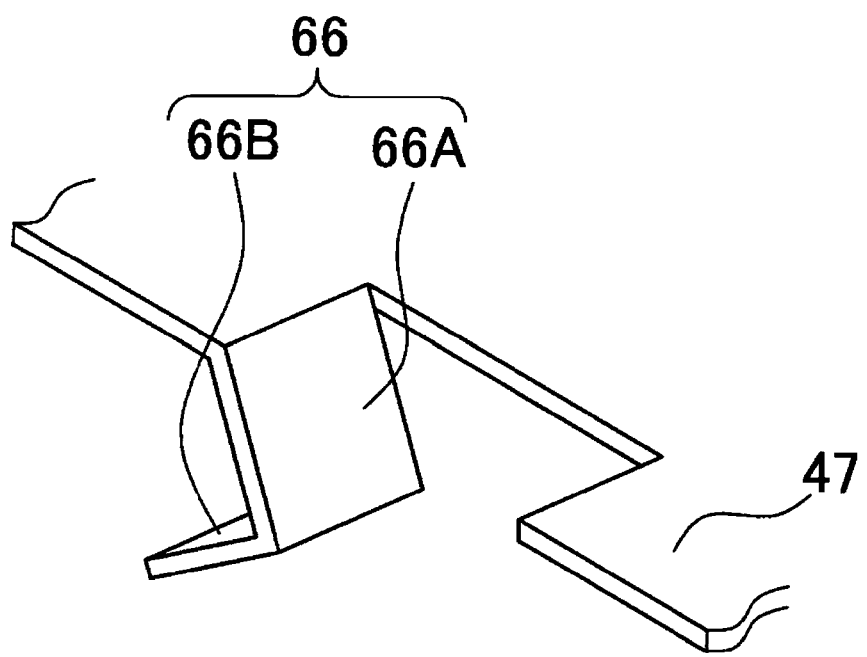
FIG. 13 is a perspective view showing Modification 5 of the circuit board of the invention.

In Modification 5 shown in FIG. 13, protruding portions 65 are disposed in place of the protruding portions 50 of the first and second embodiments.

Each of the protruding portions 65 has: a plate-like hanging portion 65A which is protruded so as to be directed from the lid body 47 in the thickness direction of the substrate 28 toward the substrate 28; and an extended portion 65B which is extended so as to be directed from a lower end portion of the hanging portion 65A along the face direction of the substrate 28.

The hanging portion 65A and the extended portion 65B are formed into a substantially L-like shape which hardly drops off from the resin portion 36.

Figure 14:
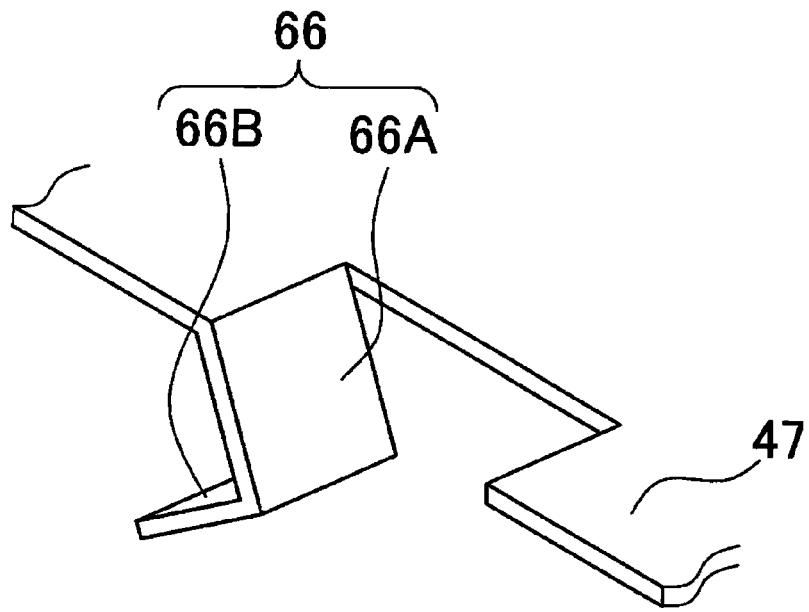
FIG. 14 is a perspective view showing Modification 6 of the circuit board of the invention.

In Modification 6 shown in FIG. 14, protruding portions 66 are disposed in place of the protruding portions 50 of the first and second embodiments.

Each of the protruding portions 66 has: a plate-like hanging portion 65A which is protruded so as to be obliquely directed from the lid body 47 in the thickness direction of the substrate 28 toward the substrate 28; and a plate-like extended portion 65B which is obliquely protruded from a lower end portion of the hanging portion 65A in a direction opposite to the hanging portion 65A.

The hanging portion 65A and the extended portion 65B are formed into a substantially dog-leg shape which hardly drops off from the resin portion 36.

Figure 15:
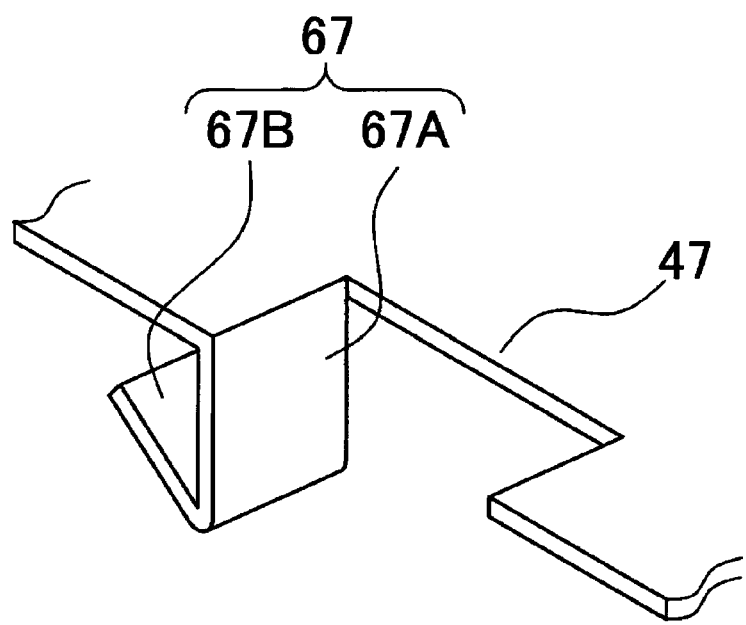
FIG. 15 is a perspective view showing Modification 7 of the circuit board of the invention.

In Modification 7 shown in FIG. 15, protruding portions 67 are disposed in place of the protruding portions 50 of the first and second embodiments.

Each of the protruding portions 67 has: a plate-like hanging portion 67A which is protruded so as to be directed from the lid body 47 in the thickness direction of the substrate 28 toward the substrate 28; and a extended portion 67B which is protruded obliquely upward with respect to the substrate 28 from a lower end portion of the hanging portion 67A.

The hanging portion 67A and the extended portion 67B are formed into a substantially V-like shape which hardly drops off from the resin portion 36.

Figure 16:
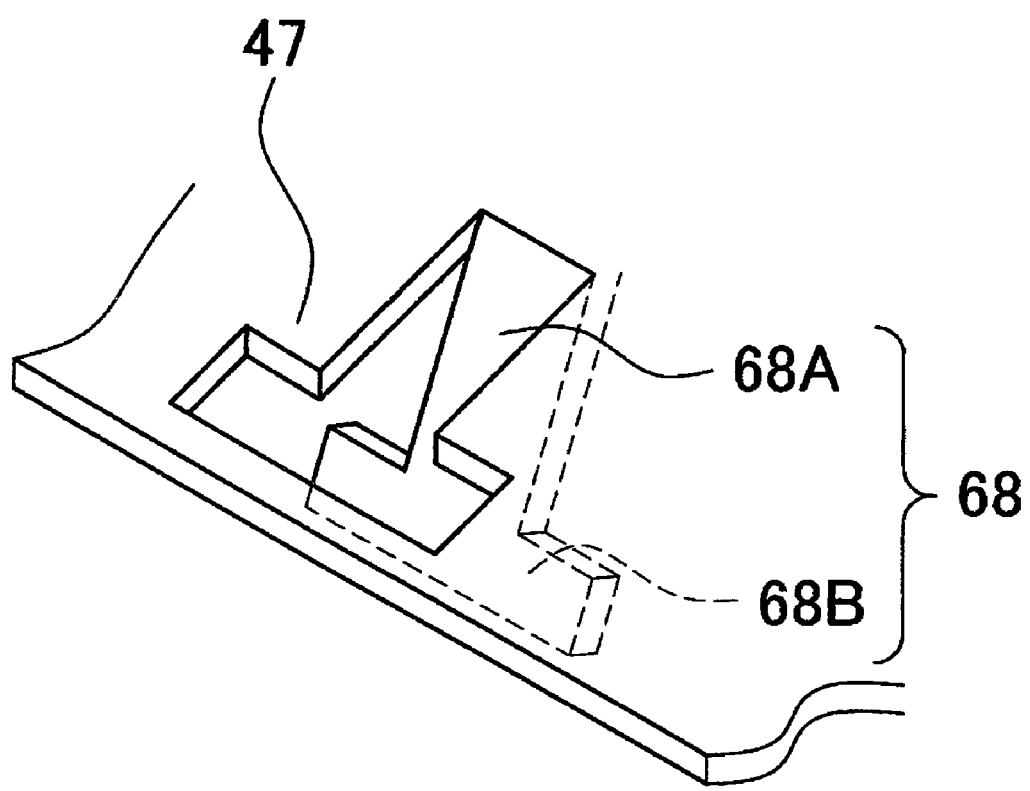
FIG. 16 is a perspective view showing Modification 8 of the circuit board of the invention.

In Modification 8 shown in FIG. 16, protruding portions 68 are disposed in place of the protruding portions 50 of the first and second embodiments.

Each of the protruding portions 68 has: a plate-like hanging portion 68A which is protruded so as to be directed from the lid body 47 in the thickness direction of the substrate 28 toward the substrate 28; and an extended portion 68B which is extended in both directions so as to be directed from a lower end portion of the hanging portion 68A along the face direction of the substrate 28.

The hanging portion 68A and the extended portion 68B are formed into a substantially T-like shape which hardly drops off from the resin portion 36.

According to Modifications 5 to 8, it is possible to achieve the same effects as the circuit boards 16, 60 of the first and second embodiments.

In the above-described first and second embodiments, the example in which the lower bent portion 41 is extended toward the outside of the frame member 30 has been described. The invention is not restricted to this. The lower bent portion 41 may be extended toward the inside of the frame member 30.

Moreover, the example in which the lower bent portion 41 is disposed in the pair of vertical side walls 38C, 38D in the wall portion 38 has been described. The invention is not restricted to this. The lower bent portion may be disposed in the whole periphery of the wall portion 38.

The shapes and configurations of portions such as the frame member 30, the lid member 34, the resin portion 36, and the raised portion 42 which have been exemplified in the first and second embodiments are not restricted to them, and may be adequately changed.

Industrial Applicability

The invention is preferably applied to a circuit board in which plural electronic components are mounted on a substrate, and a frame member is attached to the substrate so as to surround the electronic components, and also to a mobile electronic apparatus.

The invention claimed is:

1. A circuit board comprising:
   a substrate;
   one or more electronic components mounted on the substrate;
   a resin portion covering the electronic components; and
   a frame member surrounding the resin portion, wherein the frame member has (i) a wall portion fixed to the resin portion, (ii) a contact portion extending outward from the wall portion and in contact with a surface of the substrate, (iii) a raised portion extending from the contact portion and being spaced from the wall portion, and (iv) a recess between the raised portion and the wall portion.

2. The circuit board according to claim 1, wherein an electrically conductive adhesive agent is applied to an upper face of the resin portion.

3. The circuit board according to claim 1 wherein the wall portion, the contact portion and the raised portion are integral parts of the frame member.

4. An electronic apparatus comprising:
   a housing;
   a substrate disposed inside the housing;
   one or more electronic components mounted on the substrate;
   a resin portion covering the electronic components; and
   a frame member surrounding the resin portion, wherein the frame member has (i) a wall portion fixed to the resin portion, (ii) a contact portion extending outward from the wall portion and in contact with a surface of the substrate, (iii) a raised portion extending from the contact portion and being spaced from the wall portion, and (iv) a recess between the raised portion and the wall portion.

5. The electronic apparatus according to claim 4, further comprising:
a cover having a protrusion, the protrusion configured to engage with the recess formed between the raised portion and the wall portion.

6. The electronic apparatus according to claim 5 wherein the cover is a part of the housing.

7. The electronic apparatus according to claim 4 wherein an electrically conductive adhesive agent is applied to an upper face of the resin portion.

8. The electronic apparatus according to claim 4 wherein the wall portion, the contact portion and the raised portion are integral parts of the frame member.

* * * * *